United States Patent
Cioffi et al.

(10) Patent No.: US 7,642,847 B2
(45) Date of Patent: Jan. 5, 2010

(54) POWER SUPPLY PROCESSING FOR POWER AMPLIFIERS

(75) Inventors: Kenneth R. Cioffi, San Jose, CA (US); Nigel J. Tolson, Reading (GB); Earl W. McCune, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 855 days.

(21) Appl. No.: 11/415,962

(22) Filed: May 1, 2006

(65) Prior Publication Data

US 2009/0189689 A1 Jul. 30, 2009

Related U.S. Application Data

(63) Continuation of application No. 11/175,752, filed on Jul. 6, 2005, now Pat. No. 7,038,536, which is a continuation of application No. 10/833,600, filed on Apr. 27, 2004, now Pat. No. 6,924,695, which is a continuation of application No. 09/942,484, filed on Aug. 29, 2001, now Pat. No. 6,781,452.

(51) Int. Cl.
 *H03F 3/38* (2006.01)
(52) U.S. Cl. ..................... 330/10; 330/127
(58) Field of Classification Search .......... 330/10, 330/127, 129, 135, 136; 455/108, 127, 295
 See application file for complete search history.

(56) References Cited

U.S. PATENT DOCUMENTS

| 5,239,275 | A | 8/1993 | Leitch |
|---|---|---|---|
| 5,442,317 | A | 8/1995 | Stengel |
| 5,548,205 | A | 8/1996 | Monticelli |
| 5,929,702 | A | 7/1999 | Myers et al. |
| 5,936,464 | A | 8/1999 | Grondahl |
| 6,130,910 | A | 10/2000 | Anderson et al. |
| 6,307,436 | B1 | 10/2001 | Hau |
| 6,348,781 | B1 | 2/2002 | Midya et al. |
| 6,377,784 | B2 * | 4/2002 | McCune ............ 455/108 |
| 6,449,465 | B1 * | 9/2002 | Gailus et al. ......... 455/126 |
| 6,528,975 | B2 | 3/2003 | Sander |
| 2002/0090920 | A1 | 7/2002 | McCune |

FOREIGN PATENT DOCUMENTS

| EP | 0 699 986 A2 | 3/1996 |
|---|---|---|
| WO | WO00/48307 | 8/2000 |
| WO | WO03/021766 A3 | 3/2003 |

* cited by examiner

*Primary Examiner*—Henry K Choe
(74) *Attorney, Agent, or Firm*—McDermott Will & Emery LLP

(57) ABSTRACT

The present invention, generally speaking, uses multiple selectable power supply paths, a saturation detector, or combinations of the same to achieve efficient power supply processing. In one aspect of the invention, a power supply processing circuit includes a first switched converter stage and a second linear stage. Depending on the power supply desired, the first stage may be bypassed to avoid conversion losses. In another aspect of the invention, a saturation detector is used to control the first stage such that the second stage operates efficiently just short of saturation, thereby avoiding distortion.

1 Claim, 6 Drawing Sheets

POWER SUPPLY PROCESSING FOR POWER AMPLIFIERS

CROSS-REFERENCE TO RELATED APPLICATIONS

This is a continuation application of application Ser. No. 11/175,752 filed on Jul. 6, 2005 and issued as U.S. Pat. No. 7,038,536 issued on May 2, 2006 which is in turn a continuation application of application Ser. No. 10/833,600 filed on Apr. 27, 2004 issued as U.S. Pat. No. 6,924,695 issued on Aug. 2, 2005 which is in turn a continuation of application Ser. No. 09/942,484 filed on Aug. 29, 2001 and issued as U.S. Pat. No. 6,781,452 on Aug. 24, 2004.

BACKGROUND OF THE INVENTION

1. Field of the Invention

The present invention relates to power supply processing for power amplifiers.

2. State of the Art

High-efficiency power amplifiers (PAs), including radio frequency (RF) power amplifiers of a type used in RF transmitters, may be based on switch-mode techniques in which a transistor of a final amplification stage is driven between two states, a hard-on state and a hard-off state. In switch-mode operation, the output power of the final amplification stage is determined primarily by the power supply to the final amplification stage. In order to perform output power control, therefore, a mechanism is required to vary the power supply to the final amplification stage. One representative patent describing switch-mode PA techniques and corresponding power supply processing techniques is U.S. Pat. No. 3,900,823 entitled AMPLIFYING AND PROCESSING APPARATUS FOR MODULATED CARRIER SIGNALS, issued Aug. 19, 1975, incorporated herein by reference.

Three principle issues are raised with regard to power supply processing. One issue is the speed with which the power supply can be varied. Another issue is efficiency, or the extent to which losses incurred in power supply processing can be minimized. A final issue is circuit complexity and cost. Ideally, a simple, inexpensive power converter would enable rapid and precise changes in power supply. In practice, this ideal has proved unattainable. Further improvement is needed in order to achieve efficient, low-cost power amplifiers.

SUMMARY OF THE INVENTION

The present invention, generally speaking, uses multiple selectable power supply paths, a saturation detector, or combinations of the same to achieve efficient power supply processing. In one aspect of the invention, a power supply processing circuit includes a first switched converter stage and a second linear stage. Depending on the power supply desired, the first stage may be bypassed to avoid conversion losses. In another aspect of the invention, a saturation detector is used to control the first stage such that the second stage operates efficiently just short of saturation, thereby avoiding distortion.

BRIEF DESCRIPTION OF THE DRAWING

The present invention may be further understood from the following description in conjunction with the appended drawing. In the drawings.

DETAILED DESCRIPTION OF THE PREFERRED EMBODIMENTS

Figure 1:
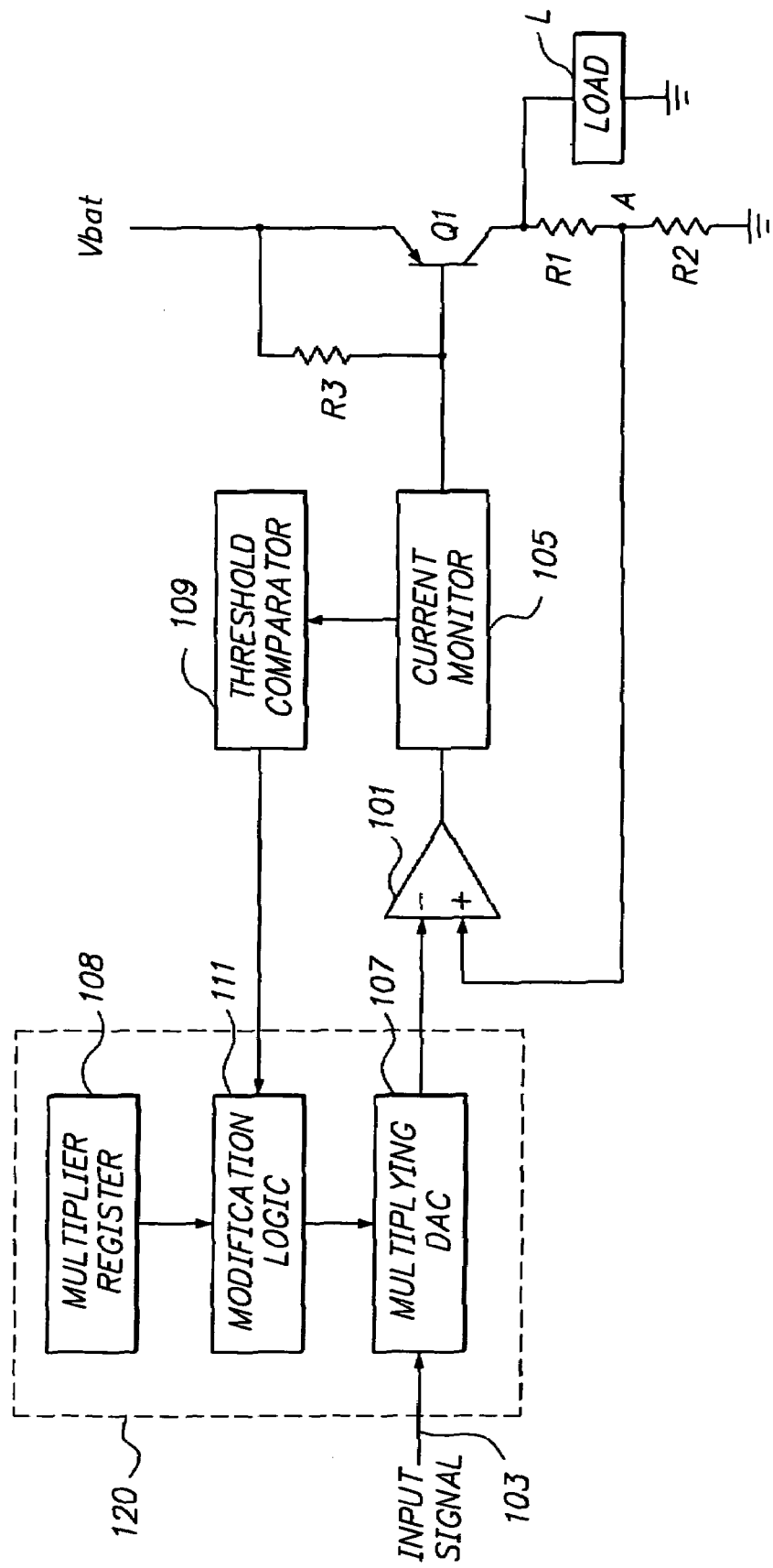
FIG. 1 is a diagram of a saturation prevention circuit that may be used with an exemplary embodiment of the invention.

The present invention is applicable to power amplifiers of all types, including switch mode power amplifiers, linear power amplifiers, etc. Therefore, although the following illustrative embodiments pertain especially to switch mode power amplifiers, it should be recognized that various other embodiments are equally embraced by the present disclosure. Referring now to FIG. 1, a diagram is shown of a saturation prevention circuit that may be used with an exemplary embodiment of the invention. (The saturation prevention circuit itself is the subject of U.S. Pat. No. 6,528,975, entitled SATURATION PREVENTION AND AMPLIFIER DISTORTION REDUCTION, filed Dec. 15, 2000 and incorporated herein by reference.) A transistor Q1 is coupled to a power source, Vbat, and to a load L.

Figure 3:
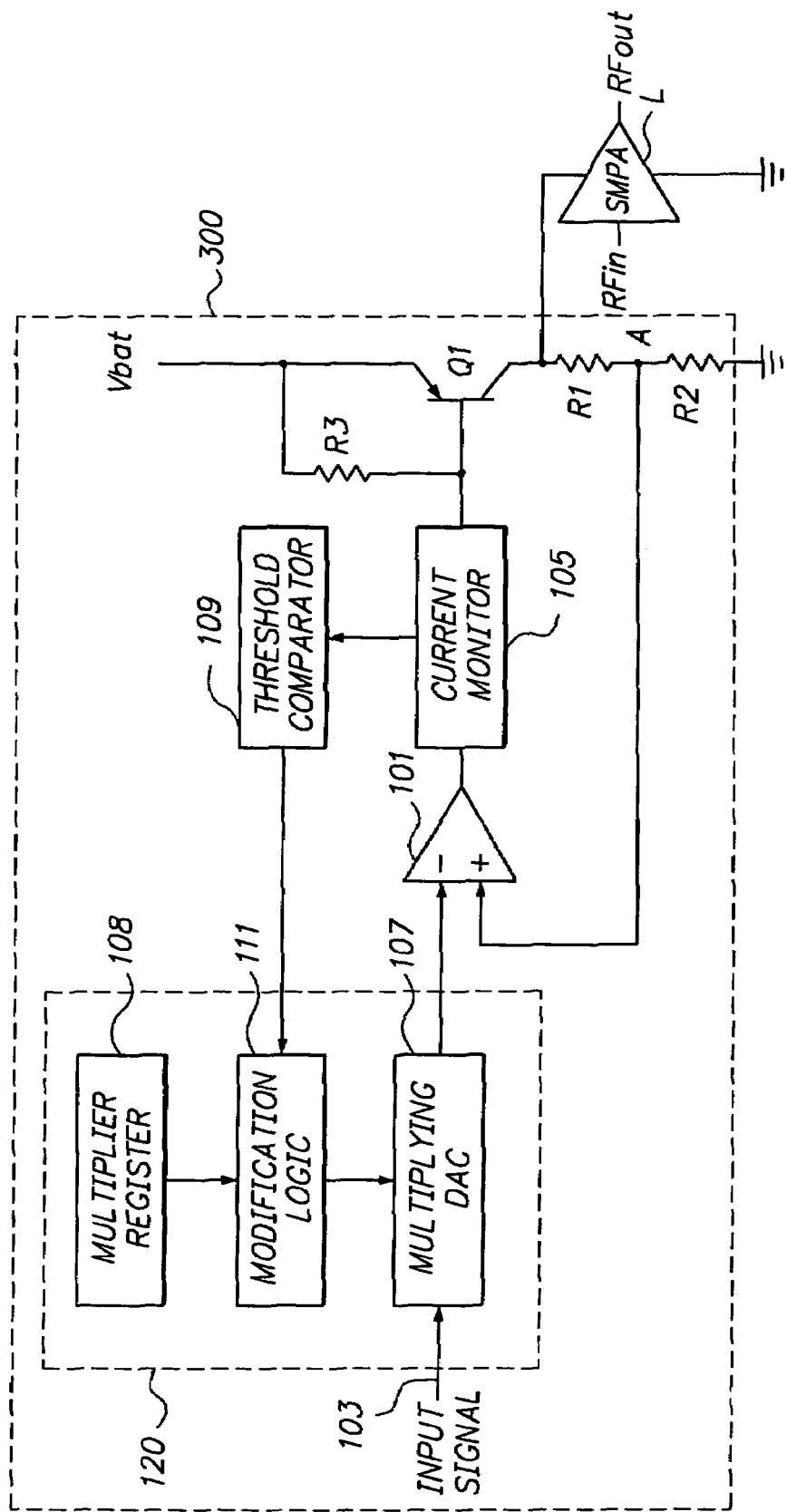
FIG. 3 is a diagram of an RF amplifier with which the saturation detector may be used.

In the present application, the load L is an RF amplifier as illustrated in FIG. 3 and described in greater detail in U.S. Pat. No. 6,377,784, entitled HIGH-EFFICIENCY MODULATING RF AMPLIFIER, filed Feb. 9, 1999 and incorporated herein by reference. Briefly, the amplifier is part of a polar (as opposed to I-Q) amplifier architecture in which separate amplitude and phase paths are provided. The phase path is coupled to an RF input of the amplifier. The amplitude path is coupled to the power supply input of the amplifier. In the embodiment of FIG. 3, therefore, circuitry 300 functions as an AM modulator.

Referring again to FIG. 1, in this configuration, the transistor Q1 is a bipolar transistor having an emitter terminal coupled to Vbat and a collector terminal coupled to the load L. The collector terminal is also coupled to a resistive network comprising series-connected resistors R1 and R2 coupled to ground. A voltage occurring at node A between the resistors R1 and R2 is proportional to the voltage applied to the load L. A resistor R3 is coupled between the emitter terminal and the base terminal of the transistor Q1. The combination of the resistors R1-R3 allows the gain of the transistor Q1 to be set.

An operational amplifier (op amp) 101 is provided as part of a feedback circuit used to control the transistor Q1 and thus set a voltage applied to the load L. (The operational amplifier may be in either discrete or integrated form.) A positive input terminal of the op amp is connected to node A of the circuit. In concept, the negative input terminal is coupled to a command input signal 103, and an output signal of the op amp 101 is coupled to the base terminal of the transistor Q1. In the illustrated circuit, however, a current monitor 105 is inserted between the output signal of the op amp 101 and the base terminal of the transistor Q1.

Furthermore, since in the illustrated circuit the command input signal is digital and the op amp 101 requires an analog input signal, a digital-to-analog converter (DAC) 107 is inserted in this path. The DAC 107 is a multiplying DAC, allowing a scale factor to be applied to the command input signal. The scale factor to be applied (at least in the absence of saturation) is stored in a multiplier register 108. This value determines the power output to the load.

Saturation prevention is carried out in response to the current monitor 105, by a threshold comparator 109 and modification logic 111. The threshold comparator is coupled to the current monitor 105 and to the modification logic 111. The modification logic is coupled to the threshold comparator 109, the multiplier register 108, and the DAC 107. Together, the modification logic 111, multiplier register 108 and multiplying DAC 107 perform a scaling function represented by block 120.

Operation of the saturation prevention circuit is based on the following principle. In order to achieve a particular voltage at node A of the circuit, the required base current into the transistor Q1 will vary linearly with the desired voltage throughout the linear range of the transistor Q1. However, as the transistor Q1 approaches saturation, the base current will rapidly rise (by action of the feedback arrangement) in an unsuccessful attempt to raise the voltage at node A to the desired level. This rapid rise in base current is detected immediately by the current monitor 105 in combination with the threshold comparator 109. The onset of saturation is thus signaled to the modification logic 111. The modification logic then modifies downward the scale factor stored in the multiplier register such that an appropriately reduced scale factor is applied to the multiplying DAC 107. As a result, the transistor Q1 is driven less heavily, and saturation is rapidly averted.

The modification logic may vary from simple to complex, and may be implemented in hardware or as code executed by a processor (as in U.S. Pat. No. 5,021,753, for example).

Figure 2:
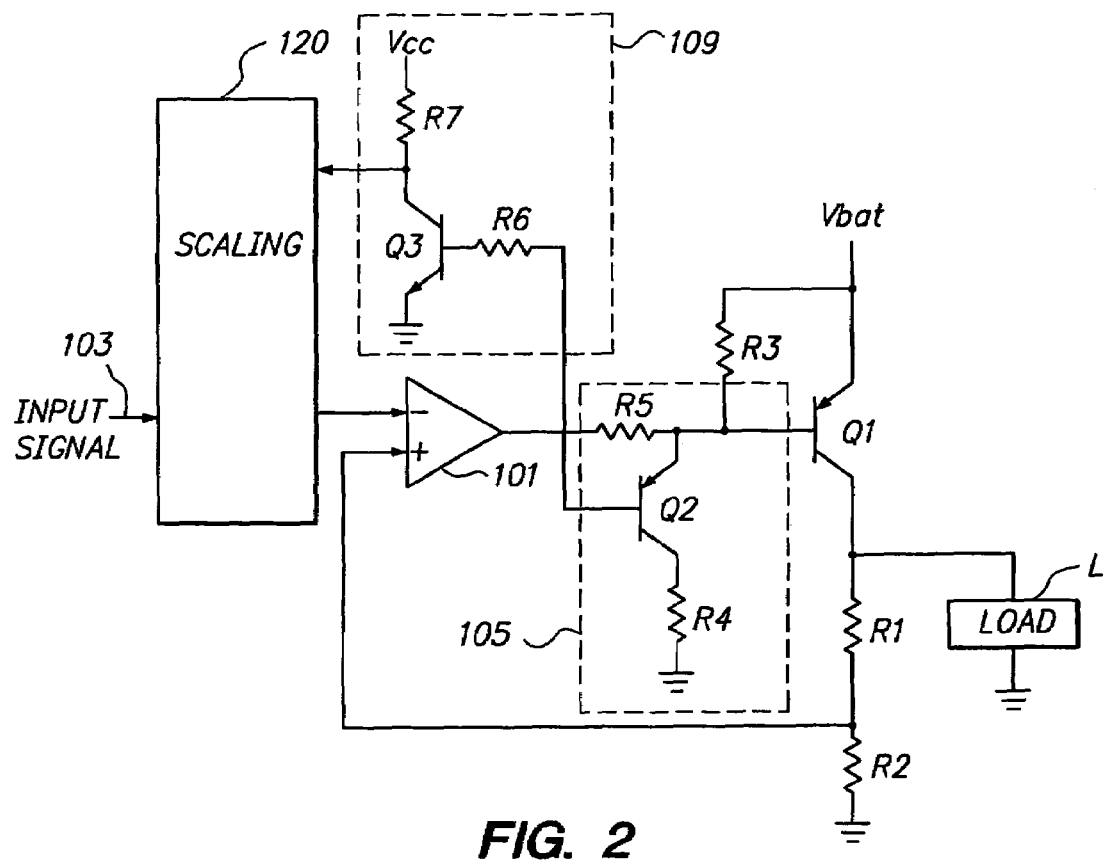
FIG. 2 shows one particular implementation of the saturation detector of FIG. 1.

Referring to FIG. 2, one particular implementation is shown, illustrating further details of the current monitor 105 and the threshold comparator 109. The current monitor may take the form of an emitter-follower stage comprising a transistor Q2 and resistors R4 and R5. The threshold comparator may take the form of a common-emitter stage comprising a transistor Q3 and resistors R6 and R7. In operation, a current flows through the resistor R4 that is proportional to the base current of the transistor Q1, and a related current flows through the resistor R7. Depending on the magnitude of the latter current, the output voltage developed at the comparator output will be either below or above a logic threshold of the scaling circuit 120.

Figure 4:
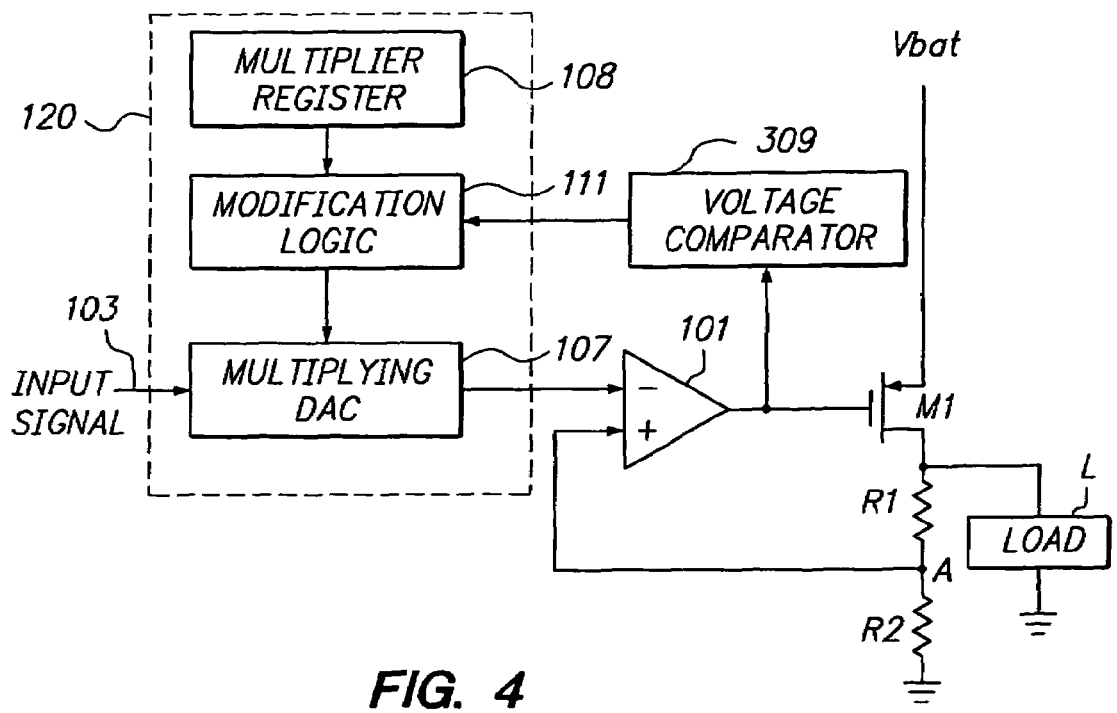
FIG. 4 is a diagram of an alternative saturation prevention circuit.

The foregoing principle of saturation detection is applicable to various different types of active elements, including, for example, field-effect transistors (FETs). An example of such a circuit is shown in FIG. 4, in which the transistor Q1 of FIG. 1 has been replaced by a FET M1. The current monitor 105 and the resistor R3 are omitted from the circuit of FIG. 4. In addition, the threshold comparator of FIG. 1 is replaced by a voltage comparator 309. As the transistor M1 approaches saturation, the gate voltage will rapidly drop (by action of the feedback arrangement) in an unsuccessful attempt to raise the voltage at node A to the desired level. This rapid drop in gate voltage is detected immediately by the voltage comparator 309 to enable corrective action to be taken.

The above descriptions apply to p-type output transistors. Similar circuits may be used with n-type output transistors (e.g., NPN, NMOS, etc.).

Figure 5:
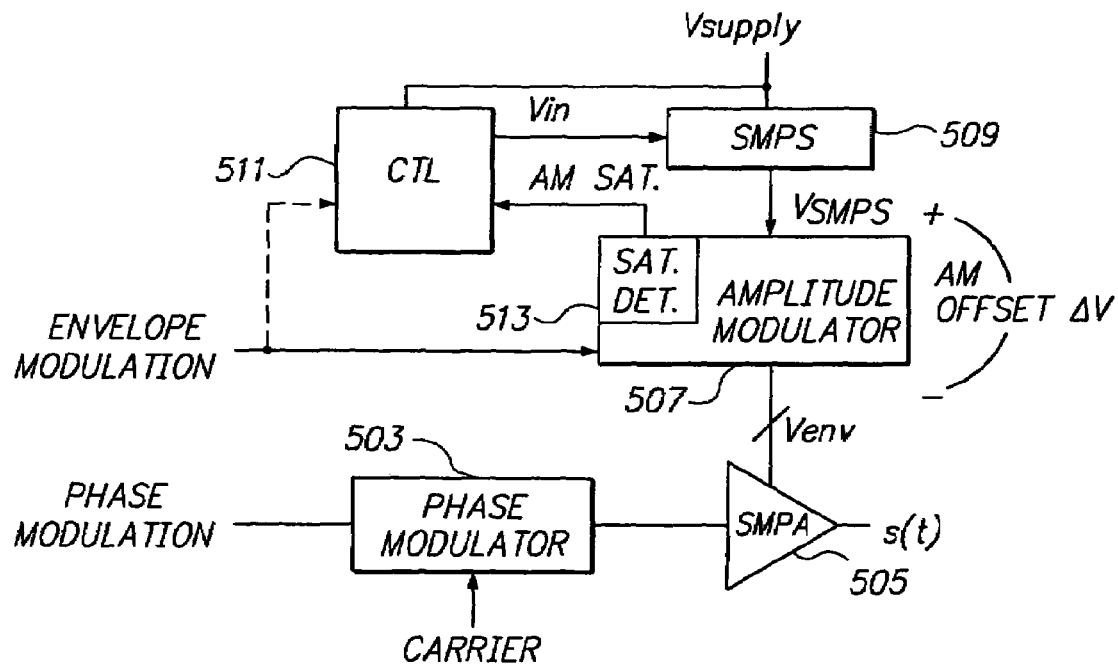
FIG. 5 is a block diagram of a power supply processing arrangement in accordance with one aspect of the present invention.

Referring now to FIG. 5, a block diagram is shown of a power supply processing arrangement in accordance with one aspect of the present invention. An RF power amplifier is provided, constructed in accordance with a polar architecture having a phase path and a separate amplitude path. In the phase path, a phase modulator 503 receives a phase modulation signal and a carrier signal and produces a phase modulated carrier signal, which is applied to the RF input of a switch-mode power amplifier (SMPA) 505. The SMPA may include multiple amplifier stages. In the amplitude path, an amplitude modulator 507 receives an envelope modulation signal and produces an envelope voltage, Venv (which may be a single voltage signal or multiple different voltage signals for multiple different amplifier stages). The envelope voltage is applied to the power supply input(s) of the SMPA.

In the arrangement of FIG. 3, described previously, the amplitude modulator 300 receives the main power supply voltage directly. In such an arrangement, when a large voltage difference exists between the main supply and the desired envelope voltage signal, this voltage difference is dropped across the amplitude modulator, resulting in inefficient operation.

Referring again to FIG. 5, this inefficiency is avoided (as also described in the second aforementioned co-pending application) by providing a switch-mode power supply (SMPS) 509 coupled between the amplitude modulator and the main supply. The envelope modulation signal is applied to control logic 511 (also powered from the main supply), which produces a control signal Vin for the SMPS. In response, the SMPS produces a voltage $V_{SMPS}$ that is some small voltage $\Delta V$ greater than the desired voltage Venv. The small voltage $\Delta V$ allows for a voltage drop across the active device of the amplitude modulator and is no greater than required to keep the device in its active region.

Further improvement may be obtained using the foregoing saturation detector, incorporated in the form of saturation detector 513 as part of the amplitude modulator 507. A saturation detection signal AM SAT is applied to the control logic. In response, the control logic boosts the command signal Vin by increasing $\Delta V$ incrementally until the saturation detection signal ceases.

For long-term efficiency, it is desirable to minimize $\Delta V$. For this purpose, the control logic may be programmed to, either continuously or periodically, reduce $\Delta V$ incrementally until saturation is detected. Various control programs may be devised to achieve this manner of operation. Basically, if saturation is detected too frequently, excessive signal distortion may result. If saturation is detected too infrequently, unnecessary power dissipation may result.

In some situations—for example if the envelope signal is not accessible—it may be desirable for the control logic to operate independently, without envelope information. (Accordingly, the envelope signal input to the control logic is indicated in dashed lines in FIG. 5.). In this mode of operation, the following procedure may be performed, at the Nyquist rate relative to the envelope signal:

1. Lower the SMPS control signal Vin until the saturation detection signal occurs.

2. Change Vin to cause the SMPS to raise the output of the SMPS by some nominal amount (e.g., 100 mV).

Bypassing the SMPS

Figure 6:
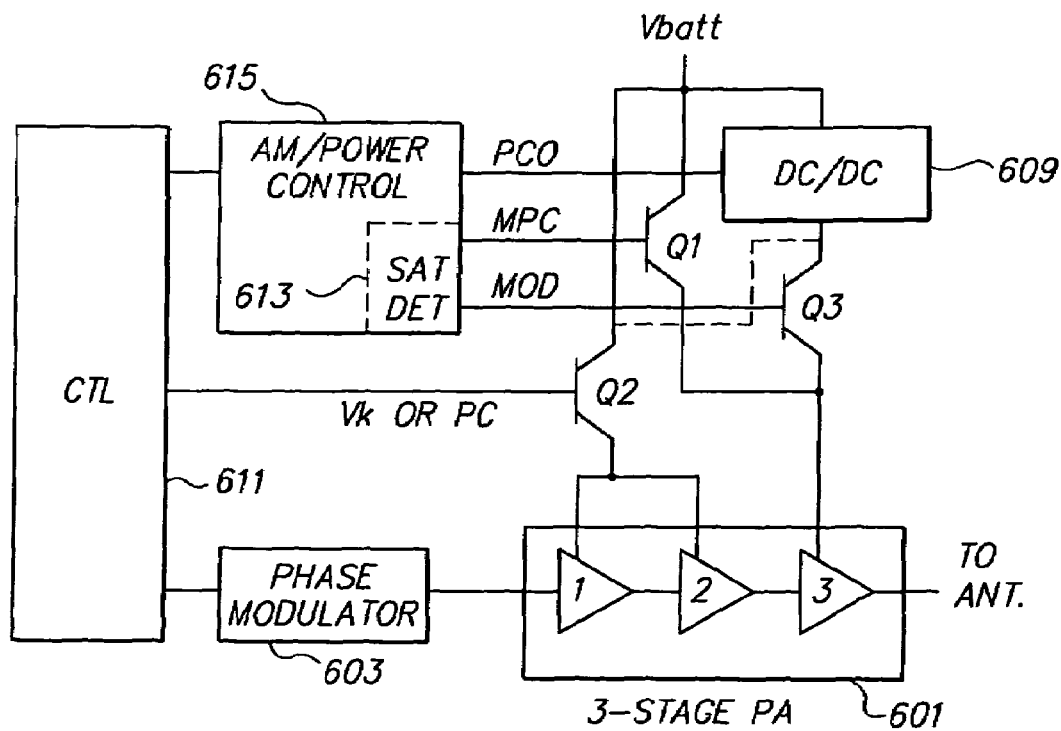
FIG. 6 is a block diagram of another power supply processing arrangement.
Figure 9:
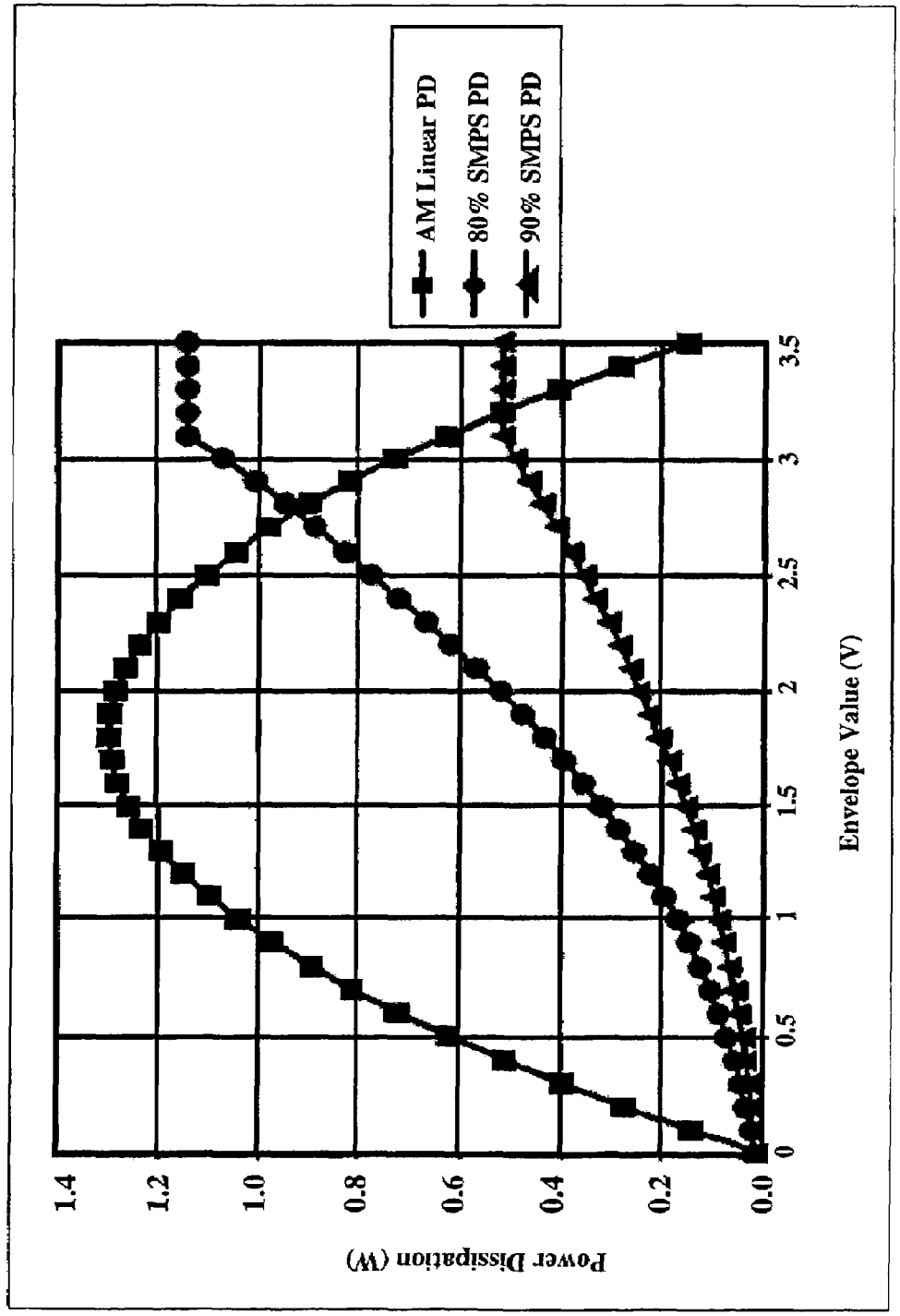
FIG. 9 is a plot illustrating, for switch mode power supplies of different assumed efficiencies, a threshold point at powers above which bypassing of the switch mode power supply is advantageous.

The efficiency of the SMPS will typically be in the range of 80-90%. However, as illustrated in FIG. 9, it has been found that at high output power (when Venv is near the main supply voltage), greater efficiency may be achieved by bypassing the SMPS. The power supply processing arrangement of FIG. 5 may therefore be modified as shown in FIG. 6. In FIG. 6, the power amplifier 601 has been shown in greater detail as including three stages, the power supply inputs of the first two stages being commonly controlled and the power supply input of the third (final) stage being controlled separately. Note, however, that such an arrangement is illustrative only and not required for purposes of the present invention. An RF input signal to the first stage is produced by a phase modulator 603, controlled by a control circuit 611.

As in the previous-described arrangement, a SMPS, or DC/DC converter 609, is interposed between a transistor Q3 and the main supply, Vbatt. The transistor Q3 functions as an AM modulator, producing the voltage applied to the power supply input of the final stage.

In this embodiment, the DC/DC converter is assumed to not be envelope—following. Therefore, the DC/DC converter is controlled from an AM/power control block 615 by a signal PCO that performs power control only. The transistor Q3 is controlled from the same block by a signal MOD that performs modulation control only. At power levels below some threshold, the voltage Venv is produced through the following path: from the supply, through the DC/DC converter, and through the transistor Q3.

In addition, a further path is provided, in parallel to the foregoing path, by a transistor Q1 coupled between the supply and the power supply input of the final stage. The transistor Q1 is controlled from the AM/power control block by a signal MPC that performs both modulation and power control. At power levels above the threshold, this path is the active path, and the transistor Q3 is cut off, disconnecting the DC/DC converter from the rest of the circuit.

In both low-power and high-power modes, stages 1 and 2 of the power amplifier are powered through a transistor Q2, controlled by the control circuit. The transistor Q2 may be coupled directly to the supply or may be coupled to the output of the DC/DC converter (or, possibly, an additional DC/DC converter). The power supply to these stages 1 and 2 may be held at a constant voltage Vk, or may be varied to perform additional power control and/or efficiency enhancement.

The AM/power control block may be provided with the saturation detector (indicated in dashed lines) described previously and may incorporate the same or similar control strategies as described previously.

Figure 7:
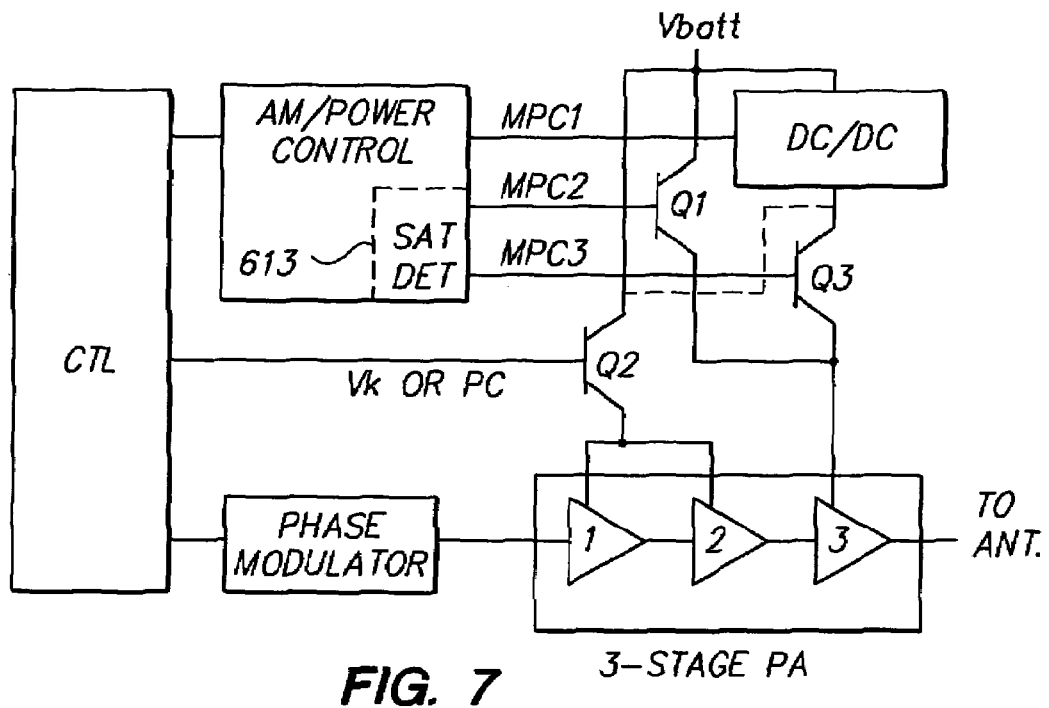
FIG. 7 is a block diagram of a further power supply processing arrangement.

A further embodiment is shown in FIG. 7. In this embodiment, the DC/DC converter is assumed to be envelope-following. Therefore, the control signals from the AM/power control block both perform power control and modulation and are therefore designated MPC1, MPC2 and MPC3.

Figure 8:
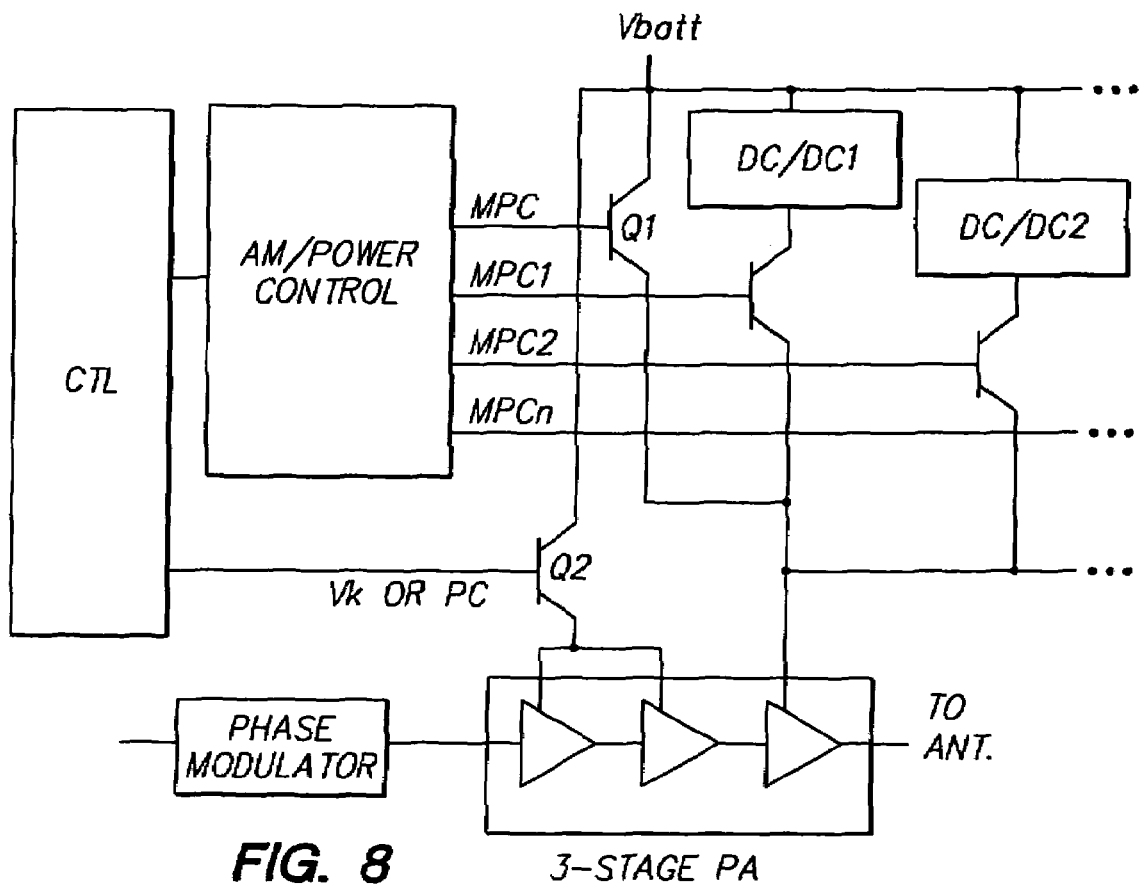
FIG. 8 is a block diagram of yet another power supply processing arrangement.

Still a further embodiment is shown in FIG. 8. In this embodiment, multiple power supply branches are provided, each including a transistor and all but one including a fixed DC/DC converter. At any given time, a single one of the power supply branches is active, depending on the desired output power level. In the case of the other branches, their transistors are cut off. Advantageously, the DC/DC converters may take the form of switch capacitor power supplies (known per se) which are fixed at fractional voltages of the battery voltage. This realization avoids large inductors that would otherwise be required in typical switch mode power supply implementations.

Thus there have been described power supply processing arrangements using multiple selectable power supply paths, a saturation detector, or combinations of the same to achieve efficient power supply processing. Using these arrangements, high efficiency and low distortion may be achieved simultaneously.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A circuit comprising:
   An amplifier element, having an amplifier input, an amplitude input, and an output;
   An input signal modulator having a first output, operable to produce a first modulated signal on the first output in response to a first input signal, the input indicative of a phase-related characteristic, the first output coupled to the amplifier input;
   An amplitude modulator having a second output, operable to produce an amplitude modulation signal on the second output, the second output coupled to the amplitude input;
   A voltage supply having a third input, coupled to the amplitude modulator;
   A control circuit coupled to the voltage supply and operable to control the output of the voltage supply;
   A detection circuit, coupled to the amplitude modulator and to the control circuit, and operable to detect a particular state of the amplitude modulator;
   the detection circuit operable to relay to the control circuit a signal indicative of the particular state of the amplitude modulator, and the control circuit operable effect a change the voltage supply in response to the signal from the detection circuit;
   wherein the change in voltage supply changes the output of the amplitude modulator.

* * * * *